United States Patent [19]

Ogawa et al.

[11] Patent Number: 4,605,876
[45] Date of Patent: Aug. 12, 1986

[54] PIEZOELECTRIC CERAMIC ENERGY TRAPPING ELECTRONIC DEVICE

[75] Inventors: Toshio Ogawa, Kyoto; Toshihiko Kittaka, Shijonawate, both of Japan

[73] Assignee: Murata Manufacturing Co., Ltd., Kyoto, Japan

[21] Appl. No.: 669,055

[22] Filed: Nov. 7, 1984

Related U.S. Application Data

[63] Continuation of Ser. No. 559,856, Dec. 12, 1983, abandoned, which is a continuation of Ser. No. 342,405, Jan. 25, 1982, abandoned.

[30] Foreign Application Priority Data

Jan. 28, 1981 [JP] Japan ................................. 56-11925

[51] Int. Cl.$^4$ ............................................. H01L 41/18
[52] U.S. Cl. .................................... 310/358; 252/62.9; 310/320
[58] Field of Search ................. 252/62.9; 310/320, 358

[56] References Cited

U.S. PATENT DOCUMENTS

| | | | |
|---|---|---|---|
| 3,526,597 | 9/1970 | Ikegami et al. | 252/62.9 |
| 3,747,176 | 7/1973 | Toyoshima | 310/320 X |
| 3,763,446 | 10/1973 | Toyoshima et al. | 310/320 |
| 4,078,284 | 3/1978 | Capek et al. | 252/62.9 |
| 4,356,421 | 10/1982 | Shimizu et al. | 310/320 |

FOREIGN PATENT DOCUMENTS

| | | | |
|---|---|---|---|
| 45-5504 | 2/1970 | Japan | 252/62.9 |
| 50-20278 | 7/1975 | Japan | 252/62.9 |
| 55-151381 | 11/1980 | Japan | 252/62.9 |

*Primary Examiner*—Jack Cooper
*Attorney, Agent, or Firm*—Birch, Stewart, Kolasch & Birch

[57] ABSTRACT

Piezoelectric ceramic compositions comprising a principal component,

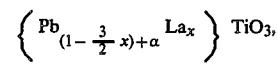

$$\left\{ Pb_{(1-\frac{3}{2}x)+\alpha} La_x \right\} TiO_3,$$

and manganese contained therein as an additive in the amount of 0.1 to 2.0 wt % of MnO$_2$ with respect to the weight of 1 mol of the principal component. The piezoelectric ceramic compositions are suitable for use for pyroelectric devices, piezoelectric vibrators, resonators, oscillators, ceramic filters, surface acoustic wave filters and so on.

8 Claims, 13 Drawing Figures

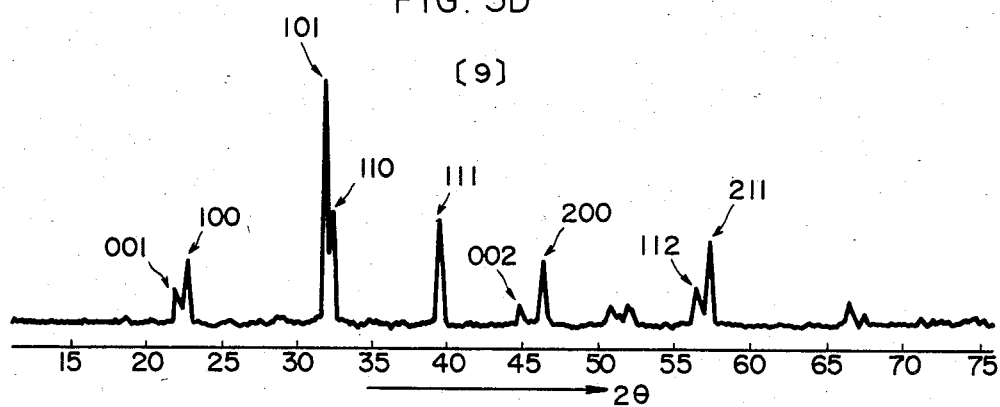
FIG. 3D
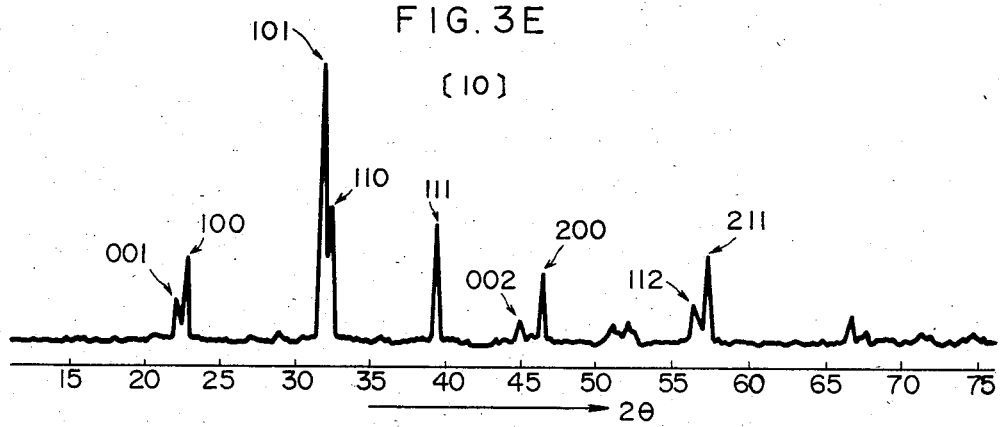
FIG. 3E
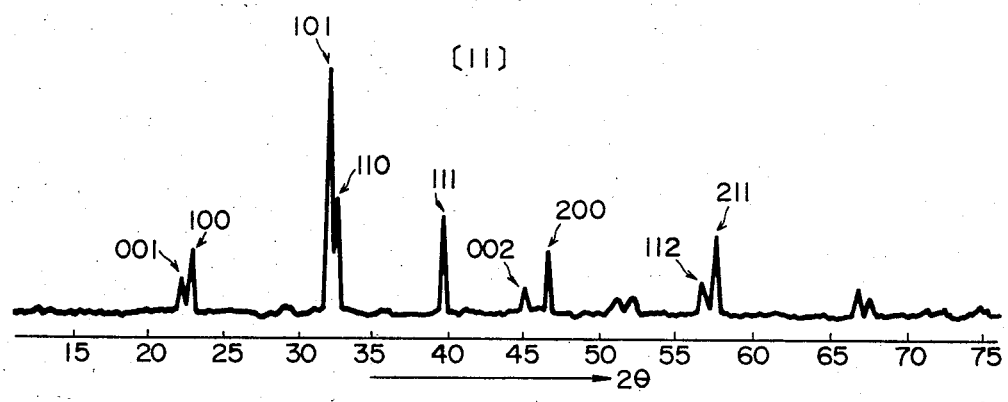
FIG. 3F

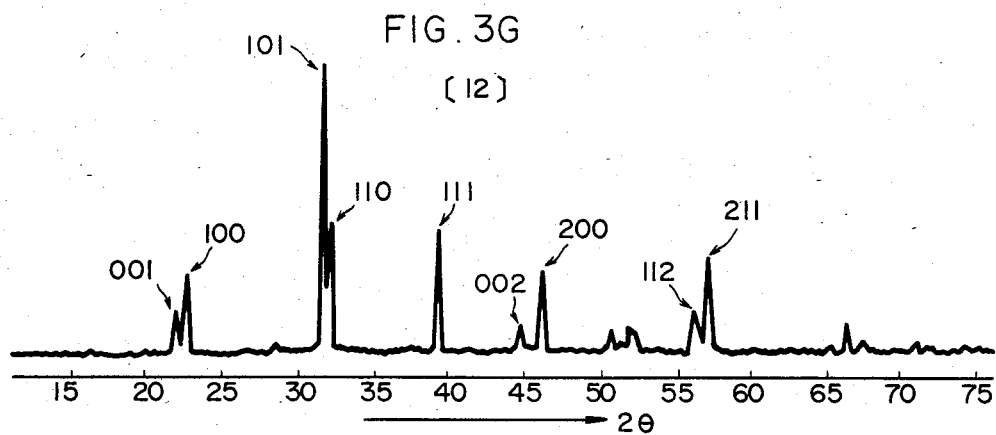
FIG. 3G
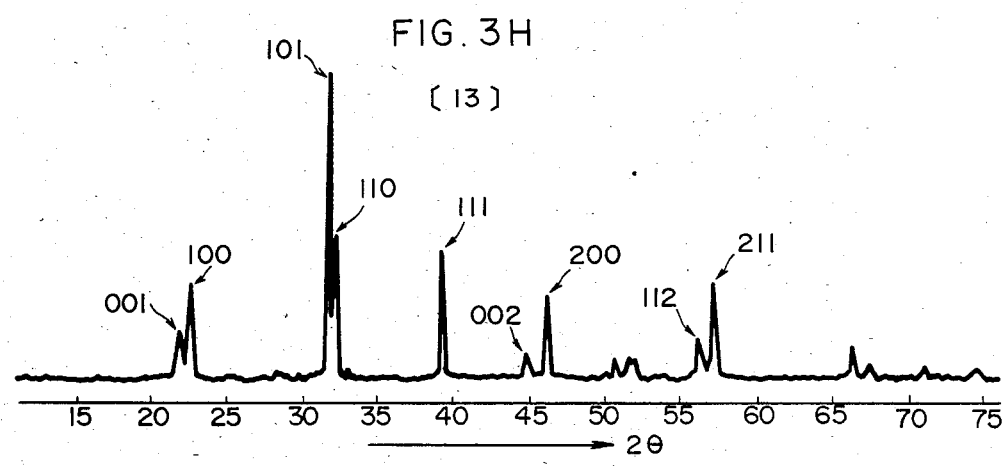
FIG. 3H
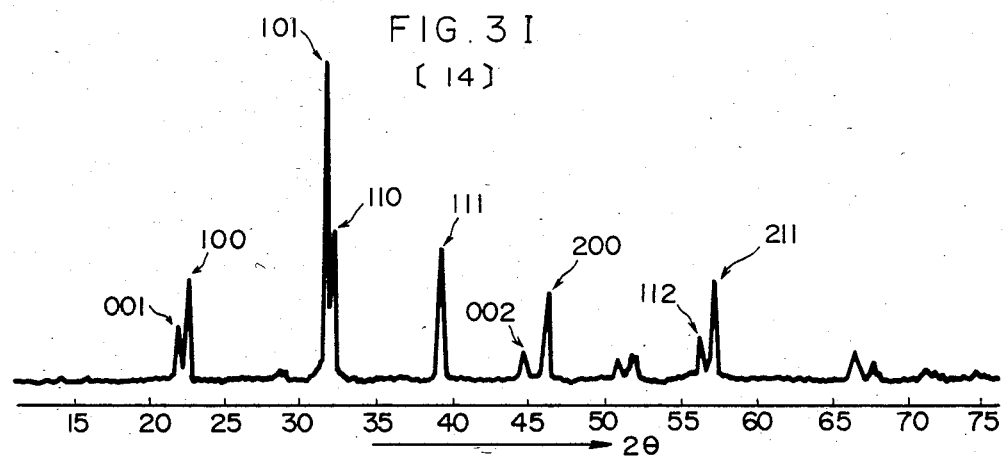
FIG. 3I

PIEZOELECTRIC CERAMIC ENERGY TRAPPING ELECTRONIC DEVICE

This application is a continuation, of application Ser. No. 559,856 filed on Dec. 12, 1983 which is a continuation of application Ser. No. 342,405 filed on Jan. 25, 1982, both now abandoned.

BACKGROUND OF THE INVENTION

1. Field of the Invention

This invention relates to piezoelectric ceramic compositions of lead titanate system.

2. Description of the Prior Art

As is known in the art, piezoelectric ceramic compositions include one which is composed principally of $PbTiO_3$, one which is composed principally of $Pb(Ti, Zr)O_3$, and one with $Pb(Mn_{1/3}Nb_{2/3})O_3$ and/or $Pb(Ni_{1/3}Nb_{2/3})O_3$ dissolved in the solid state in said principal components as a second or a third component.

Of these, the binary or ternary system with $Pb(Ti, Zr)O_3$ as the principal component are further given various additives to improve piezoelectric and electric characteristics, and these are used in pyroelectric devices, piezoelectric vibrators, resonators, oscillators, ceramic filters, surface acoustic wave filters and so on. On the other hand, a modified $PbTiO_3$ system ceramic composition wherein Pb is replaced by another metal has a larger electromechanical coupling coefficient in thickness mode vibration than in contour mode vibration and a small dielectric constant (which characteristics are not found in the material composed of $Pb(Ti, Zr)O_3$ system). As a result, where thickness mode vibration is utilized, the spurious vibration due to the contour mode becomes small, providing a merit that impedance matching with an external circuit is facilitated up to the high frequency region. However, since it is impossible to trap the energy of fundamental thickness expansion mode vibration near by the electrode, there is a defect that the fundamental thickness expansion mode vibration will not appear sharply. Further, another defect is that the temperature vs. resonant frequency characteristic is such that resonant frequency decreases linearly with increasing temperature. More particularly, the temperature coefficient of resonant frequency is between $-50$ and $-100$ ppm/°C. This corresponds to the phenomenon of ceramics becoming softer with increasing temperature. Because of these defects, it has been very difficult to use modified $PbTiO_3$ system ceramics wherein Pb is replaced by another metal for resonators, oscillators, ceramic filters and so on.

SUMMARY OF THE INVENTION

Accordingly, a principal object of this invention is to provide a lead titanate system piezoelectric ceramic composition which eliminates the defects described above.

According to the present invention, there is provided piezoelectric ceramic compositions comprising a principal component,

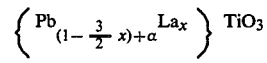

where $0.09 \leq x \leq 0.20$ and $-0.20 \leq \alpha \leq +0.20$, and manganese contained therein as an additive in the amount of 0.1 to 2.0 wt % of $MnO_2$ with respect to the weight of 1 mol of the principal component.

It has been found that when the ceramics of this invention are used for an electronic device such as a resonator, oscillator, ceramic filter or the like, it is preferable to apply it in the thickness expansion third overtone mode vibration rather than the thickness expansion fundamental mode vibration. Therefore, the restriction on the above mentioned composition is derived on the basis of the third overtone mode vibration, as will be later described. However, it should be pointed out that it is not intended to restrict the ceramics of this invention to applications where the third overtone mode vibration is used.

Further, as previously described, it has been found that the ceramics of this invention have a larger electromechanical coupling coefficient in thickness expansion mode vibration than in the contour mode vibration. Therefore, the above mentioned restriction on composition is derived mainly on the basis of thickness expansion mode vibration.

In the composition described above, part of Pb is replaced by La. The reason why the amount of La must be not less than 9 atom % is that if not, the temperature coefficient of resonant frequency for the third overtone mode vibration in thickness expansion mode will be more than 5 ppm/°C. The reason for specifying the upper limit of the amount of La to be 20 atom % is that if not, temperature coefficients of resonant frequency for the third overtone mode vibration in thickness expansion mode will be more than 5 ppm/°C. and mechanical quality factor for the third overtone mode vibration in thickness expansion mode becomes small.

The reason for specifying the amount of $MnO_2$ be within the range of 0.1 to 2.0 wt % is that if it is less than 0.1 wt %, the temperature coefficient of resonant frequency for the third overtone mode vibration in thickness expansion mode will not become less than 5 ppm/°C. whereas if it exceeds 2.0 wt %, the specific resistance of the ceramics becomes so small that the ceramics can be hardly polarized.

Further, if it is satisfied the two conditions that the amount of La is limited within the range of 0.095 to 0.135 atom % and that the amount of $MnO_2$ limited within the range of 0.2 to 1.5 wt %, the temperature coefficient of resonant frequency for the third overtone mode vibration in thickness expansion mode is not more than 2 ppm/°C. and has improved linearity.

As for the amount of Pb, experimental results show that it can be considerably changed without influencing the crystal structure. More particularly, after the amount of Pb in the principal component is adjusted in connection with the amount of La in consideration of valence of cation sites, it can be increased or decreased with the range of 0 to 20 atom %. The exceeding of $+20$ atom % in the amount of Pb results in considerable grain growth thus making it impossible to obtain a dense ceramics. Reversely, the descending of $-20$ atom % in the amount of Pb results in the formation of a second phase, thereby greatly decreasing the piezoelectricity.

In case where the amount of Pb is increased or decreased within the range of 1 to 20 atom % while the amount of Pb is adjusted in connection with the amount of La in consideration of valences, the resulting ceramics is characterized by maintaining a Perovskite structure, though the ceramic is not stoichiometrically equilibrated.

Particularly in case where the amount of Pb is decreased within the range of 1 to 15 atom %, it has been found that, remarkably, the resulting ceramics show the following effect for characteristics in comparision with stoichiometrical piezoelectric ceramics.

That is, there is a tendency to increase the value of an electromechanical coupling coefficient for the third overtone mode vibration (Kt3). Further, the value of a mechanical quality factor in the third overtone mode vibration (Qmt3) is increased. The high value of the mechanical quality factor means the low value of resonant impedance, providing the advantage that the ceramics are resonating or oscillating under the condition of lower driving voltage. It can be said that this is extremely advantageous characteristics for a resonator or oscillator. Further, if the mechanical quality factor in the third overtone mode vibration is higher, antiresonant impedance also becomes higher, thereby the ratio of resonant and antiresonant impedances becomes greater, thus making it possible to stabilize resonating or oscillating. Furthermore, the temperature coefficient of resonant frequency for the third overtone mode vibration in thickness expansion mode (Cfr.t3) is small to the extent of not more than 1.3 ppm/°C. and, therefore, a piezoelectric ceramic composition having stable temperature characteristics which are comparative to that of a quartz oscillator can be obtained.

In addition, it will become apparent from the following description of embodiments that the resulting ceramics is maintained to have the Perovskite structure even when the amount of Pb is increased or decreased.

Further, when the piezoelectric ceramics obtained by firing in an oxygen atmosphere containing not less than 80 vol %, the ceramics have a little fluctuation of the specific resistance since the metal oxide in the composition, e.g., Mn is kept in a high valence state by the sufficient oxidation.

Other objects and features of the invention will become more apparent from the following description when taken in conjunction with the following table and the accompanying drawings.

BRIEF DESCRIPTION OF THE DRAWINGS

FIGS. 3A to 3I show the results of X-ray diffraction analysis by $CuK_\alpha$ for samples, with the sample numbers as shown in Table;

DESCRIPTION OF THE PREFERRED EMBODIMENTS

Examples of this invention will now be described.

As raw materials, PbO (or $Pb_3O_4$), $TiO_2$, $La_2O_3$ and $MnO_2$ were used. Besides these, it is, of course, possible to use a material which will eventually change into said oxide, e.g., $MnCO_3$.

The principal component represented by the general formula

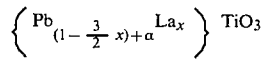

and the additive $MnO_2$ were weighed off to provide composition ratios shown in the Table and the respective compositions were wet-mixed in a ball mill. After mixing, they were dehydrated, dried, and calcined at 850° C. to 1000° C. for two hours. The calcined powders together with an organic binder were crushed, mixed, dried and granulated. The granulated powders were formed under a pressure of about 1000 kg/cm² into disks having a diameter of 20 mm and a thickness of 1.5 mm.

The disks were then fired at 1150° C. to 1300° C. for two hours to provide ceramics. Some disks were formed on both surfaces with silver electrodes by baking and some were ground to reduce the thickness to about 0.3 mm and then formed with silver electrodes by vaccum evaporation for use for measurement of resonator characteristics, and they were subjected to polarization treatment at 20° C. to 200° C., 2 to 8 kV/mm for about 5 to 60 minutes.

After polarizing, disks and resonators having a diameter of 1 to 2 mm (resonance frequency; 23 MHz) on the thin plate were measured dielectric and piezoelectric characteristics for dielectric loss (tan δ), dielectric constant (ε), electromechanical coupling coefficient for radial mode vibration (Kp), mechanical quality factor for radial mode vibration (Qmp), electromechanical coupling coefficient for fundamental vibration in thickness expansion mode (Kt), electromechanical coupling coefficient for the third overtone vibration in thickness expansion mode (Kt3), mechanical quality factor for the third overtone vibration in thickness expansion mode (Qmt3), temperature coefficient for resonant frequency of fundamental vibration in thickness expansion mode (Cfr.t), and temperature coefficient for resonance frequency of the third overtone vibration in thickness expansion mode (Cfr.t3), the results of the measurements being also shown in Table.

In addition, Sample Nos. 17 and 37 show values obtained with piezoelectric ceramics subjected to firing in an oxygen atmosphere (the atmosphere concentration being 100 vol % and 80 vol %, respectively). For those for which piezoelectric characteristics were not obtained, values for tan δ and ε prior to polarization treatment are given in Table.

As for temperature coefficients (Cfr.t: Cfr.t3) for resonance frequency, the difference between the maximum and minimum values in the temperature range of −20° C. to +80° C. was obtained and divided by the value for 20° C.

In Table, the asterisk indicates that the sample is out of the scope of the present invention, the others being within the scope of the invention.

Figure 1:
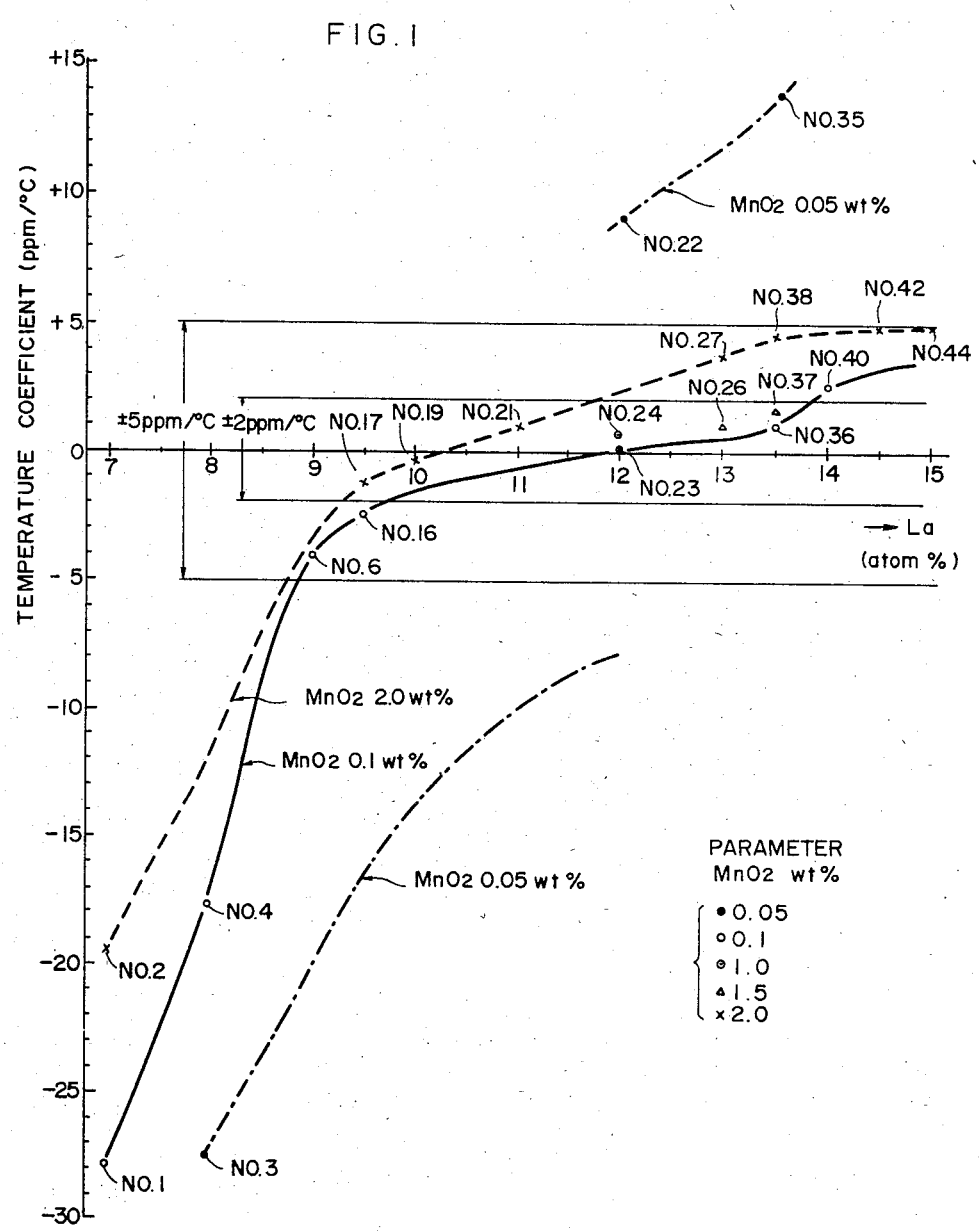
FIG. 1 is a graph showing the relation between the amount of La and the temperature coefficient for the third overtone vibration in thickness expansion mode for each sample shown in Table, with the amount of $MnO_2$ as a parameter.

FIG. 1 is a graph showing the relation between the amount of La (atom %) and the temperature coefficient (Cfr.t3) for the third overtone vibration in thickness expansion mode, with the amount of MnO2 as a parameter. As can be seen in this graph, the amounts of La and MnO2 in those samples whose temperature coefficient is within the range of ±5 ppm/°C. are selected as compositions which fall within the scope of the present invention. Further, the amounts of La and MnO2 in those samples whose temperature coefficient is within the range of ±2 ppm/°C. are selected as compositions in more preferable embodiments.

As will be evident from Table, the samples with the value of $\alpha$ ranging from −0.01 to −0.15 have a excellent temperature coefficient for resonant frequency of the third overtone vibration in thickness expansion mode (Cfr.t3) within the range of ±1.3 ppm/°C.

Figure 2:
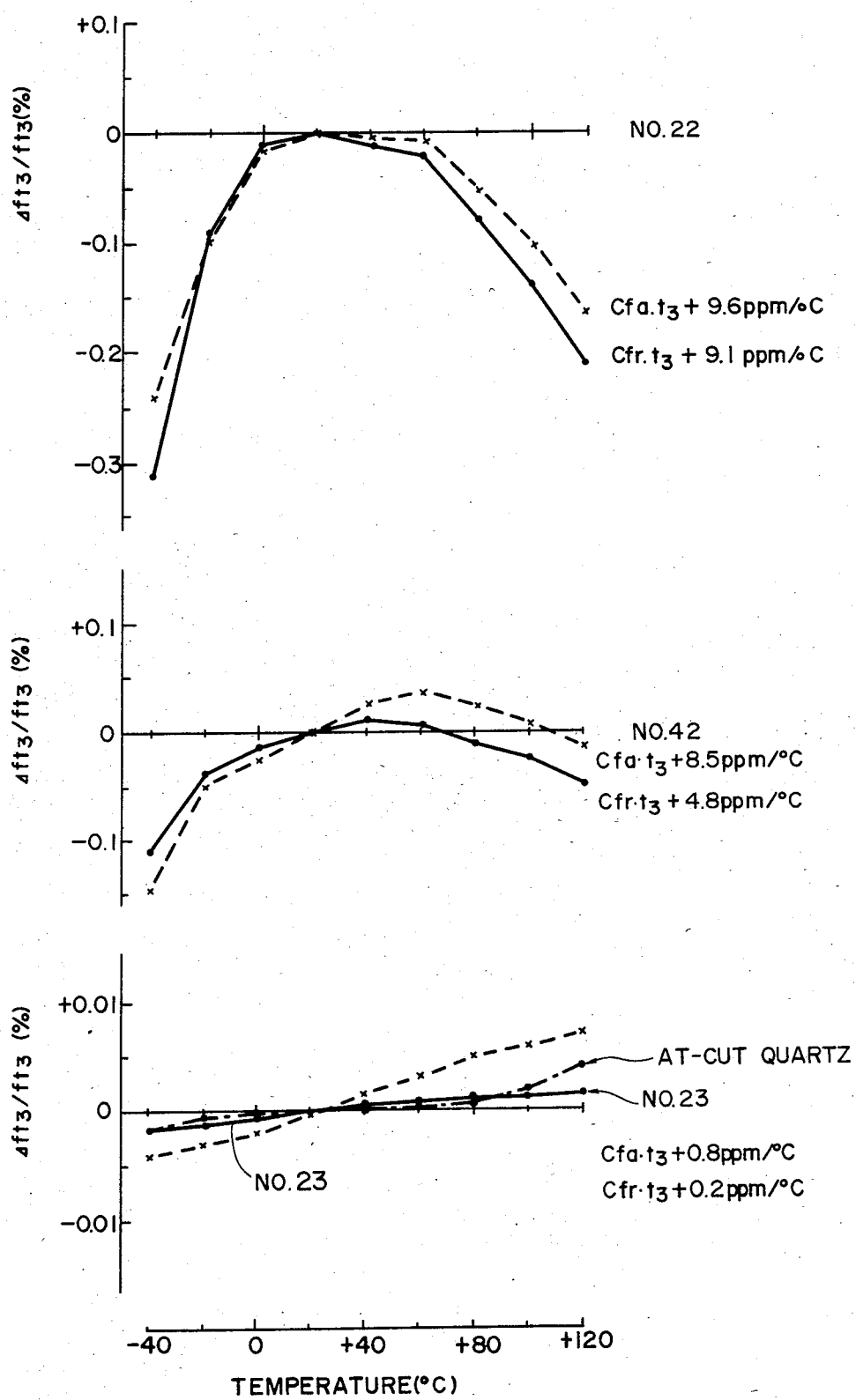
FIG. 2 shows temperature-dependent changes of the third overtone vibration resonant frequency in thickness expansion mode in terms of a rate of change based on 20° C., with respect to samples which are within the scope of this invention and one which is outside the scope of this invention.
Figure 3A:
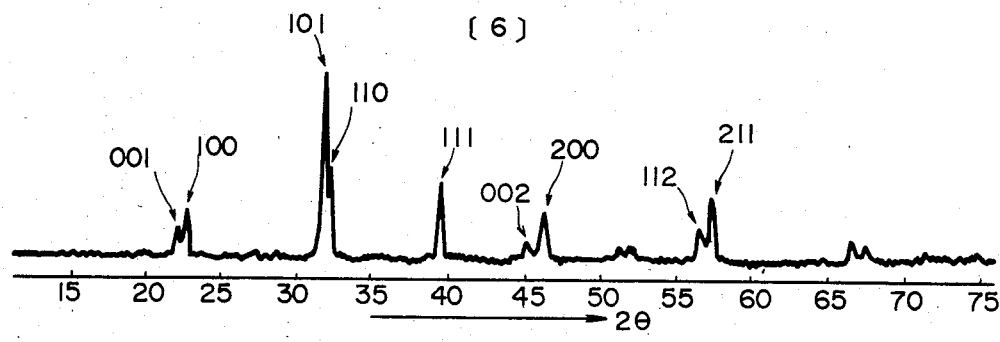
Figure 3B:
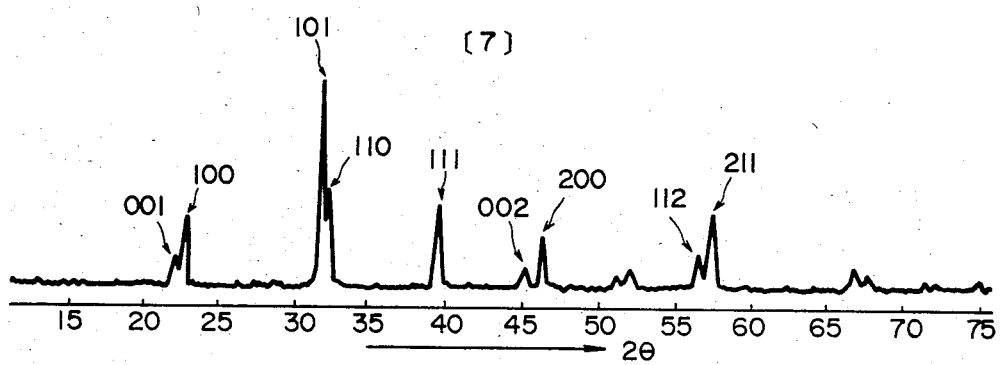
Figure 3C:
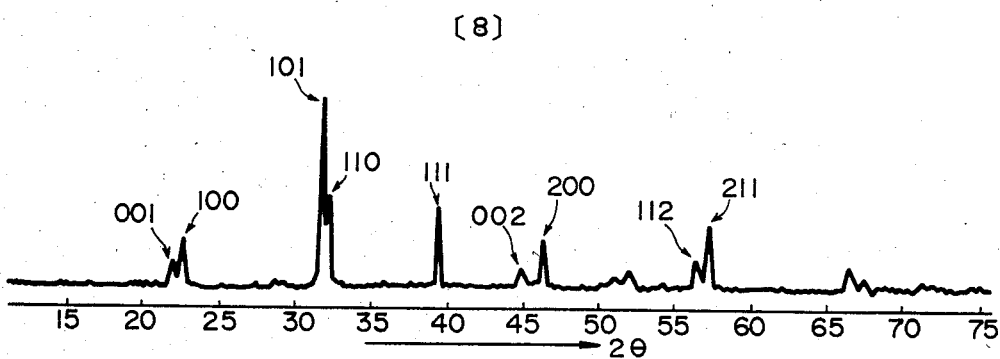

FIGS. 2 shows temperature-dependent changes of resonant frequency for the third overtone vibration in thickness expansion mode in terms of a rate of change ($\Delta$fr.t3/fr.t3) based on 20° C., with respect to samples which are within the scope of the invention (Sample Nos. 23 and 42) and one which is out of the scope of the invention (Sample No. 22). The rate of change of antiresonant frequency ($\Delta$fa.t3/fa.t3) for each sample is shown in broken lines. Further, the temperature coefficient (Cfr.t3) for resonant frequency and the temperature coefficient (Cfa.t3) for antiresonant frequency are also shown.

As can be best seen in FIG. 2, whereas Sample No. 22 has a large secondary temperature coefficient, according to this invention such secondary temperature coefficient can be reduced, as in Sample No. 42. Moreover, it is possible to obtain a sample whose primary temperature coefficient is very small, as in Sample No. 23. In addition, the graph for Sample No. 23 is shown with an enlarged scale on the vertical axis as compared with Sample Nos. 22 and 42. Thus, there are obtained characteristics which are not so much different as compared with the tertiary temperature coefficient for the temperature characteristics (dash-dot line) of AT-cut quartz crystal.

Further, it can be understood that according to the present invention ceramics whose dielectric constant and frequency temperature coefficient are both low are obtained, as is clear from Table and so on. As for frequency temperature characteristics, it has been ascertained that with the stability almost equal to that of quartz oscillators, and the second temperature coefficient and the primary temperature coefficient are both satisfactory.

In addition, samples corresponding to Sample Nos. 17 and 37 were subjected to firing in an atmosphere whose oxygen atmosphere concentration was 100 vol % and 80 vol %, respectively, and in air (characteristic value data not shown). The results showed that the fluctuation in Kt and Kt3 for firing in oxygen atmosphere was 0.5 % in average when expressed by the ratio, (standard deviation)/(mean value). This value is about ⅓ of the value for firing in air.

FIGS. 3A to 3I show the results of X-ray diffraction analysis by CuK$_\alpha$ for samples wherein $\alpha$ is increased or decreased within the range of −0.20 to +0.20. The numeral shown in each drawing indicates each sample number.

As seen from FIGS. 3A to 3I, it can be understood that even if $\alpha$ is increased or decreased within the range of −0.20 to +0.20, such samples have a Perovskite structure.

Figure 4:
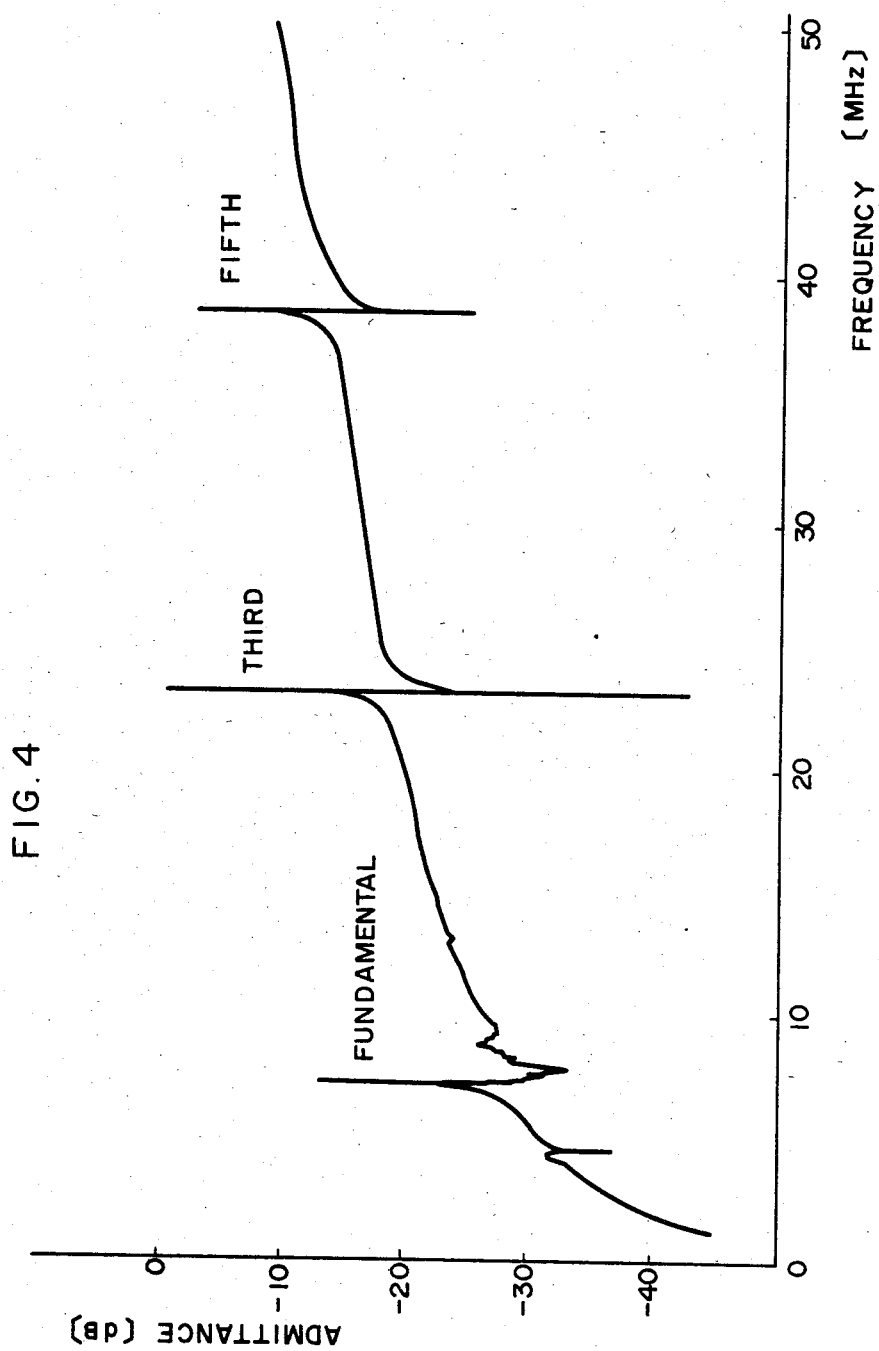
FIG. 4 is a graph showing frequency-admittance characteristics of samples within the scope of this invention.

FIG. 4 is a graph showing frequency-admittance characteristics of samples within the scope of this invention, depicting admittance characteristics including the fundamental, third and fifth overtone vibrations in thickness expansion mode.

Figure 5:
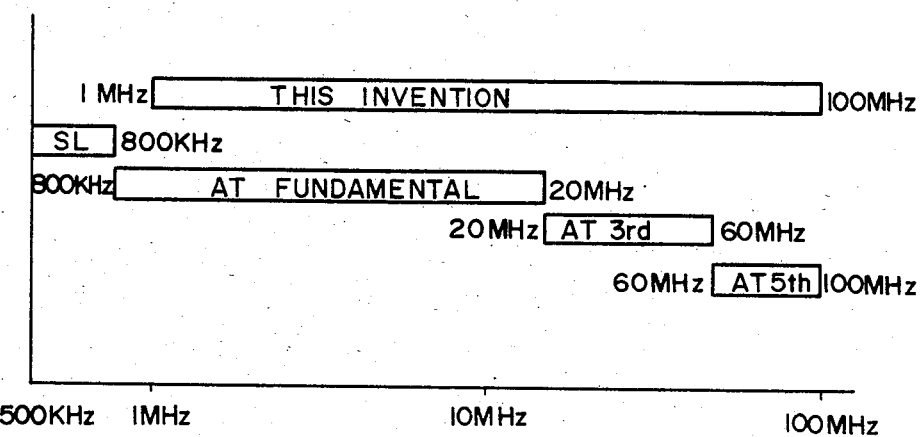
FIG. 5 is a view showing frequency regions in which this invention and quartz vibrators can be used.

As can also be seen in this graph, in the ceramics of this invention, for use for resonators and oscillators, it is preferable to use the third overtone vibration in thickness expansion mode. That is, the excitation level of the third overtone vibration is greater than that of the fundamental vibration and, moreover, is sharp. Further, the electromechanical coupling coefficient (Kt3) for the third overtone vibration in thickness expansion mode, as is also clear from Table, is about 10% and it is also possible to obtain a high mechanical quality factor (Qmt3) which is above 4,000. For these reasons, when the third overtone vibration is used, a resonator and oscillator of superior characteristic will be obtained. Further, in the case of quartz oscillator of the same frequency range, they usually have a 20–40 mm square size, but according to this invention, they can be reduced in size, e.g., down to 5×5×2 mm. Further, in the case of quartz oscillator, as shown in FIG. 5, in a frequency range of 1 to 100 MHz, the waves are classified into AT fundamental vibration, AT third overtone vibration and AT fifth overtone vibration and respective oscillating circuits associated therewith will be required, but with the ceramics of this invention the third overtone vibration can be continuously used by changing the thickness of ceramics, thereby making it possible to simplify oscillating circuits. These may be said to the features in which the invention is superior to quartz vibrators. Further, the ceramics of this invention have as small a dielectric constant as 250–350, being suitable for high frequency use.

Further, with the ceramics of this invention, it is possible to obtain a superior narrow band low-loss filter by using the third overtone vibration in thickness expansion mode. That is, the ceramics whose mechanical quality factor (Qmt3) for the third overtone vibration in thickness expansion mode is greater than 4,000 can be easily obtained, and hence a filter becomes with a low-loss and the ceramics whose electromechanical coupling coefficient (Kt3) for the third overtone vibration in thickness expansion mode is about 10% can be obtained, and hence a filter has a narrow band.

While the invention has been shown and described with reference to certain preferred embodiments thereof, it will be understood by those skilled in the art that various changes in details may be made therein without departing from the spirit and scope of the invention as set forth in the following claims.

TABLE

| Sample No. | Composition x | $\alpha$ | MnO$_2$ (wt %) | tan$\delta$ (%) | $\epsilon$ | Kp (%) | Qmp | Kt (%) | Kt$_3$ (%) | Qmt$_3$ | Cfr.t (ppm/°C.) | Cfr.t$_3$ (ppm/°C.) |
|---|---|---|---|---|---|---|---|---|---|---|---|---|
| 1* | 0.07 | 0 | 0.1 | 1.28 | 264 | 6.2 | 1123 | 52 | 6.6 | 1523 | −45 | −27.8 |
| 2* | 0.07 | +0.05 | 2.0 | 1.82 | 229 | 5.7 | 746 | 51 | 5.4 | 3048 | −43 | −19.4 |

TABLE-continued

| Sample No. | Composition x | α | MnO₂ (wt %) | tanδ (%) | ε | Kp (%) | Qmp | Kt (%) | Kt₃ (%) | Qmt₃ | Cfr.t (ppm/°C.) | Cfr.t₃ (ppm/°C.) |
|---|---|---|---|---|---|---|---|---|---|---|---|---|
| 3* | 0.08 | 0 | 0.05 | 1.12 | 289 | 5.8 | 1300 | 50 | 5.8 | 1401 | −49 | −27.4 |
| 4* | 0.08 | −0.05 | 0.1 | 1.10 | 261 | 7.9 | 1417 | 49 | 7.3 | 2396 | −47 | −17.7 |
| 5* | 0.09 | −0.20 | 0.01 | 1.98 | 303 | 8.3 | 212 | 50 | 8.1 | 523 | −60 | −53 |
| 6 | 0.09 | −0.20 | 0.1 | 0.76 | 271 | 7.9 | 1661 | 49 | 8.0 | 2681 | −50 | −4.0 |
| 7 | 0.09 | −0.15 | 0.1 | 0.75 | 268 | 8.1 | 1724 | 50 | 8.8 | 3947 | −48 | −1.2 |
| 8 | 0.09 | −0.10 | 0.1 | 0.77 | 276 | 8.3 | 1807 | 51 | 9.0 | 4062 | −47 | +0.3 |
| 9 | 0.09 | −0.05 | 0.1 | 0.72 | 280 | 8.2 | 1971 | 50 | 8.9 | 3988 | −50 | +1.0 |
| 10 | 0.09 | −0.01 | 0.1 | 0.71 | 282 | 8.2 | 2025 | 50 | 9.0 | 4155 | −49 | +0.3 |
| 11 | 0.09 | 0 | 0.1 | 0.70 | 287 | 8.0 | 2063 | 47 | 7.8 | 2693 | −61 | −3.9 |
| 12 | 0.09 | +0.05 | 0.1 | 0.68 | 291 | 7.9 | 2086 | 46 | 7.7 | 2607 | −75 | −4.2 |
| 13 | 0.09 | +0.10 | 0.1 | 0.67 | 293 | 7.7 | 2098 | 45 | 7.6 | 2581 | −81 | −4.6 |
| 14 | 0.09 | +0.20 | 0.1 | 0.65 | 296 | 7.8 | 2105 | 46 | 7.8 | 2574 | −89 | −4.9 |
| 15* | 0.09 | 0 | 2.5 | — | — | — | — | — | — | — | — | — |
| 16 | 0.095 | +0.10 | 0.1 | 0.70 | 287 | 9.6 | 2073 | 50 | 8.5 | 2943 | −53 | −2.5 |
| 17 | 0.095 | −0.10 | 2.0 | 1.20 | 265 | 8.8 | 1416 | 49 | 8.5 | 3051 | −52 | −1.3 |
| 18* | 0.10 | +0.25 | 0.1 | — | — | — | — | — | — | — | — | — |
| 19 | 0.10 | +0.15 | 2.0 | 1.62 | 261 | 7.6 | 932 | 49 | 8.0 | 3170 | −43 | −0.4 |
| 20* | 0.11 | −0.25 | 1.0 | — | — | — | — | — | — | — | — | — |
| 21 | 0.11 | 0 | 2.0 | 1.44 | 271 | 8.0 | 1050 | 48 | 8.8 | 3306 | −60 | +0.9 |
| 22* | 0.12 | 0 | 0.05 | 0.45 | 313 | 9.7 | 1567 | 48 | 8.5 | 2450 | −95 | +9.1 |
| 23 | 0.12 | +0.10 | 0.1 | 0.50 | 296 | 9.6 | 1534 | 47 | 9.5 | 3634 | −72 | +0.2 |
| 24 | 0.12 | −0.10 | 1.0 | 0.70 | 289 | 10.3 | 1216 | 47 | 9.6 | 4337 | −70 | +0.7 |
| 25* | 0.12 | −0.10 | 3.0 | — | — | — | — | — | — | — | — | — |
| 26 | 0.13 | 0 | 1.5 | 0.90 | 304 | 9.6 | 1023 | 48 | 9.5 | 3439 | −70 | +1.1 |
| 27 | 0.13 | +0.10 | 2.0 | 1.16 | 302 | 8.8 | 935 | 47 | 9.5 | 4126 | −68 | +3.7 |
| 28 | 0.13 | −0.20 | 2.0 | 1.26 | 293 | 9.2 | 876 | 50 | 9.9 | 3863 | −56 | −3.4 |
| 29 | 0.13 | −0.15 | 2.0 | 1.25 | 291 | 9.4 | 893 | 54 | 10.7 | 6101 | −44 | −0.5 |
| 30 | 0.13 | −0.05 | 2.0 | 1.23 | 294 | 9.6 | 899 | 54 | 10.8 | 6348 | −47 | +0.2 |
| 31 | 0.13 | −0.01 | 2.0 | 1.23 | 295 | 9.5 | 921 | 53 | 10.5 | 5734 | −50 | +0.6 |
| 32 | 0.13 | 0 | 2.0 | 1.21 | 298 | 9.0 | 933 | 49 | 9.6 | 4197 | −65 | +3.5 |
| 33 | 0.13 | +0.05 | 2.0 | 1.19 | 300 | 8.9 | 948 | 48 | 9.6 | 4182 | −66 | +3.6 |
| 34 | 0.13 | +0.20 | 2.0 | 1.15 | 305 | 8.5 | 1059 | 45 | 9.2 | 4055 | −75 | +4.5 |
| 35* | 0.135 | −0.20 | 0.05 | 0.30 | 365 | 12.9 | 2337 | 47 | 9.8 | 2576 | −55 | +13.9 |
| 36 | 0.135 | −0.05 | 0.1 | 0.44 | 340 | 11.7 | 1966 | 47 | 10.0 | 2557 | −73 | +1.0 |
| 37 | 0.135 | +0.15 | 1.5 | 0.80 | 325 | 10.1 | 1390 | 46 | 9.8 | 3598 | −71 | +1.6 |
| 38 | 0.135 | +0.20 | 2.0 | 1.08 | 325 | 8.9 | 983 | 46 | 9.7 | 4984 | −70 | +4.5 |
| 39* | 0.140 | +0.25 | 1.0 | — | — | — | — | — | — | — | — | — |
| 40 | 0.140 | 0 | 0.1 | 0.42 | 353 | 12.0 | 2054 | 46 | 10.3 | 2794 | −73 | +2.5 |
| 41* | 0.145 | −0.25 | 0.1 | — | — | — | — | — | — | — | — | — |
| 42 | 0.145 | 0 | 2.0 | 0.95 | 334 | 9.0 | 1021 | 46 | 9.8 | 5321 | −76 | +4.8 |
| 43* | 0.149 | 0 | — | 2.83 | 406 | 14.9 | 234 | 48 | 10.3 | 565 | −92 | −65 |
| 44 | 0.149 | +0.15 | 2.0 | 0.60 | 359 | 10.8 | 1529 | 45 | 9.9 | 3379 | −79 | +4.9 |
| 45 | 0.149 | −0.15 | 2.0 | 1.08 | 347 | 9.6 | 1048 | 45 | 9.8 | 3979 | −80 | +0.5 |
| 46 | 0.150 | −0.05 | 0.5 | 0.52 | 346 | 13.1 | 1956 | 48 | 11.1 | 3874 | −77 | −0.1 |
| 47 | 0.150 | −0.05 | 2.0 | 0.97 | 337 | 13.0 | 2054 | 49 | 11.5 | 3998 | −78 | +0.3 |
| 48 | 0.150 | 0 | 2.0 | 1.13 | 353 | 12.5 | 2109 | 45 | 10.0 | 3050 | −85 | −4.5 |
| 49 | 0.175 | −0.20 | 1.0 | 0.76 | 395 | 14.0 | 1893 | 46 | 12.4 | 2893 | −92 | −3.9 |
| 50 | 0.175 | −0.15 | 1.0 | 0.82 | 398 | 15.0 | 1910 | 50 | 13.8 | 5322 | −82 | −1.0 |
| 51 | 0.175 | −0.01 | 1.0 | 0.95 | 402 | 15.1 | 2015 | 49 | 13.9 | 5451 | −85 | −0.3 |
| 52 | 0.175 | −0.01 | 1.5 | 1.23 | 400 | 14.9 | 2154 | 49 | 13.7 | 5629 | −84 | +0.2 |
| 53 | 0.175 | 0 | 1.0 | 1.18 | 407 | 14.4 | 2248 | 45 | 12.8 | 3025 | −90 | −4.9 |
| 54 | 0.200 | −0.10 | 0.5 | 0.64 | 443 | 15.8 | 2705 | 49 | 14.5 | 5870 | −80 | −1.3 |
| 55 | 0.200 | 0 | 0.1 | 0.72 | 468 | 15.1 | 2874 | 46 | 12.0 | 3805 | −91 | −5.0 |
| 56 | 0.200 | 0 | 0.5 | 0.87 | 449 | 15.0 | 2919 | 45 | 11.8 | 3522 | −95 | −4.7 |
| 57 | 0.200 | +0.20 | 0.5 | 1.03 | 455 | 14.7 | 3053 | 43 | 11.5 | 3419 | −97 | −5.0 |
| 58* | 0.210 | −0.05 | 0.1 | 0.44 | 474 | 15.0 | 2563 | 45 | 11.5 | 3084 | −105 | −5.6 |
| 59* | 0.210 | −0.05 | 1.5 | 1.18 | 496 | 15.3 | 2570 | 44 | 11.2 | 3007 | −111 | −6.3 |
| 60* | 0.210 | 0 | 2.0 | 1.33 | 481 | 14.7 | 2433 | 40 | 10.0 | 2766 | −123 | −8.9 |

What is claimed is:

1. A piezoelectric ceramic energy trapping electronic device using the thickness expansion third overtone mode vibration, said device having a composition comprising as a principal component,

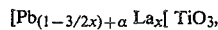

and manganese contained therein as an additive in an amount of 0.1 to 2.0 wt % of MnO₂ with respect to the weight of 1 mole of said principal component, where $0.09 \leq x \leq 0.20$, and $-0.20 \leq \alpha \leq +0.20$, wherein the temperature coefficient for the third overtone mode vibration in thickness expansion mode (Cfr.t₃) is within the range of −5ppm/°C. to +5ppm/°C.

2. A piezoelectric ceramic device as set forth in claim 1, wherein $-0.15 \leq \alpha \leq -0.01$.

3. A piezoelectric ceramic device as set forth in claim 1, wherein $0.095 \leq x \leq 0.135$, and the amount of MnO₂ is 0.2 to 1.5 wt % per mol of said principal component.

4. The piezoelectric ceramic device as set forth in claim 3, wherein the raw materials PbO or Pb₃O₄, TiO₂, La₂O₃ and MnO₂ that are used in the preparation of said principal component are calcined at a temperature of 850° to 1000°, formed into disks fired at a temperature of 1150° to 1300° C. in an atmosphere containing 80 vol % or more of oxygen.

5. A piezoelectric ceramic electronic device as in claim 1, which is a vibrator.

6. A piezoelectric ceramic electronic device as in claim 1, which is a resonator.

7. A piezoelectric ceramic electronic device as in claim 1, which is an oscillator.

8. A piezoelectric ceramic electronic device as in claim 1, which is a filter.

* * * * *